United States Patent
Tay et al.

(10) Patent No.: US 9,851,377 B2
(45) Date of Patent: Dec. 26, 2017

(54) UNIVERSAL HOLDING APPARATUS FOR HOLDING A DEVICE UNDER TEST

(71) Applicant: Rohde & Schwarz Asia Pte Ltd., Singapore (SG)

(72) Inventors: ChunGuan Tay, Singapore (SG); Rajashekar Durai, Singapore (SG); Sheheen Muhamed, Singapore (SG); CheeShen Lau, Singapore (SG); Shiwei Pang, Singapore (SG)

(73) Assignee: ROHDE & SCHWARZ ASIA PTE, LTD., Singapore (SG)

( * ) Notice: Subject to any disclaimer, the term of this patent is extended or adjusted under 35 U.S.C. 154(b) by 141 days.

(21) Appl. No.: 14/844,426

(22) Filed: Sep. 3, 2015

(65) Prior Publication Data
US 2017/0067936 A1  Mar. 9, 2017

(51) Int. Cl.
*G01R 31/00* (2006.01)
*G01R 1/04* (2006.01)

(52) U.S. Cl.
CPC .................. *G01R 1/0408* (2013.01)

(58) Field of Classification Search
CPC .... H04M 1/04; H04M 1/0254; H04M 1/0274; H04M 1/72519; H04M 1/72527; H04M 1/72547; H04W 24/00; H04W 52/0209; H04W 72/1231; H04W 72/085; H04W 88/02; G01R 31/2808; G01R 31/2815; G01R 31/2818; G06K 9/00288; G06K 9/00577; G06K 9/228; G06K 9/4604; G06K 9/4647; G06K 9/4652; G06K 9/4671; G06K 9/6253; H01R 2201/20; H01R 31/06; H01R 13/6205
See application file for complete search history.

(56) References Cited

U.S. PATENT DOCUMENTS

7,696,937 B2  4/2010  Raimann

*Primary Examiner* — Vinh Nguyen
(74) *Attorney, Agent, or Firm* — Jenkins, Wilson, Taylor & Hunt, P.A.

(57) ABSTRACT

Universal holding apparatus for holding a device under test, DUT, said universal holding apparatus comprising: a base plate configured to mount at least two DUT holders for holding the device under test each DUT-holder having at least one pad, wherein the at least two DUT-holders are positionable on said base plate to clamp said device under test, DUT, between them, wherein the pad of at least one of said DUT-holders for holding the device under test, DUT, is slidable to adjust a clamping distance between the DUT-holders for engaging said device under test, DUT.

9 Claims, 8 Drawing Sheets

UNIVERSAL HOLDING APPARATUS FOR HOLDING A DEVICE UNDER TEST

FIELD OF THE INVENTION

The invention relates to a universal holding apparatus for holding a device under test, in particular a mobile device.

TECHNICAL BACKGROUND

Casings of devices can have different shapes and sizes. For example smartphones, data modules and any kind of development prototypes of such devices have different shapes and sizes. Moreover the position of the mobile devices control buttons and test access ports also differ from device to device. The devices can for instance comprise RF connectors, USB-connectors and power supply connectors. When testing a conventional electronic device under test this device under test DUT is connected to a test equipment. However, connecting a device under test can be inconvenient and prone to errors. For example a delicate RF connection at the device under test DUT may come off easily or can be damaged due to shaking, twisting and pulling by the RF cable from the test equipment. An unsecured device under test also moves when a test operator needs to press control buttons of the device under test or does a device under test user interface. This can also cause the delicate RF connection at the access device under test DUT to come off. This inconvenience in testing of electronic devices also results in a lower productivity because a test in progress can be unnecessarily disrupted so that the test sequence has to be rerun. Further the test operator has to carry out a test with extra care in order to minimize movement of the respective device under test DUT so that the test time is further increased.

Accordingly there is a need for a universal holding apparatus for holding a device under test, which overcomes the above-mentioned impediments.

SUMMARY OF THE INVENTION

The invention provides according to first aspect of the present invention a universal holding apparatus for holding a device under test, DUT, said universal holding apparatus comprising:
a base plate configured to mount at least two DUT-holders for holding the device under test, DUT, each DUT-holder having at least one pad attached to a body of said DUT holder,
wherein the at least two DUT-holders are positionable on the base plate to clamp said device under test, DUT, between them,
wherein the body of at least one of the DUT-holders for holding the device under test, DUT, is—slidable relative to a base portion of said DUT holder to adjust a clamping distance between the DUT-holders for engaging said device under test, DUT.

In a further possible embodiment of the universal holding apparatus according to the first aspect of the present invention said base plate comprises a plurality of mounting holes arranged in a predetermined array especially in a mounting hole grid array with predetermined spacings provided between each of said mounting holes.

In a further possible embodiment of the universal holding apparatus according to the first aspect of the present invention the slidable pad of the at least one DUT-holder is fixable by a locking screw in a fixed position.

In a further possible embodiment of the universal holding apparatus according to the first aspect of the present invention the pads of the DUT-holders are formed by elastic cushion pads.

In a further possible embodiment of the universal holding apparatus according to the first aspect of the present invention at least one RF holder is mounted to said base plate, said RF holder comprising at least one adapter provided for securing an RF connection between an RF connector of the device under test, DUT, and a test equipment.

In a further possible embodiment of the universal holding apparatus according to the first aspect of the present invention the device under test, DUT, held by said universal holding apparatus is a flat mobile device.

In a further possible embodiment of the universal holding apparatus according to the first aspect of the present invention the DUT-holders are adapted to clamp said flat mobile device under test DUT, horizontally or vertically between the pads of said DUT-holders.

In a further possible embodiment of the universal holding apparatus according to the first aspect of the present invention the flat mobile device clamped between the pads comprises a smartphone having control buttons and test access ports to be connected to a test equipment.

In a further possible embodiment of the universal holding apparatus according to the first aspect of the present invention the DUT-holders and/or RF holders of said universal holding apparatus comprise one or more mounting protrusions, especially pins or lugs, adapted to be inserted into that mounting holes of said base plate of the universal holding apparatus.

The invention provides according to a second aspect a shielding box comprising
a bottom and
a cover forming a receiving chamber configured to receive a universal holding apparatus adapted to hold a device under test, DUT, said universal holding apparatus comprising:
a base plate configured to mount at least two DUT-holders for holding the device under test, DUT, each DUT-holder having at least one pad attached to a body of said DUT holder,
wherein the at least two DUT-holders are positionable on that base plate to clamp said device under test, DUT, between them,
wherein the pad of at least one of the DUT-holders for holding the device under test, DUT, is slidable relative to a base portion of said DUT holder to adjust a clamping distance between the DUT-holders for engaging the device under test, DUT.

The invention provides according to a third aspect a testing arrangement for mobile devices comprising at least one universal holding apparatus adapted to hold a mobile device under test,
said universal holding apparatus having
a base plate configured to mount at least two DUT-holders for holding the device under test each DUT-holder having at least one pad wherein the at least two DUT-holders are positionable on said base plate to clamp said device under test, DUT, between them,
wherein the pad of at least one of the DUT-holders for holding the device under test, DUT, is slidable relative to a base portion of said DUT holder to adjust a clamping distance between the DUT-holders for engaging the device under test.

BRIEF DESCRIPTION OF THE FIGURES

In the following possible embodiments of the different aspects of the present invention are described in more detail is referenced to the enclosed figures.

DETAILED DESCRIPTION OF EMBODIMENTS

Figure 1:
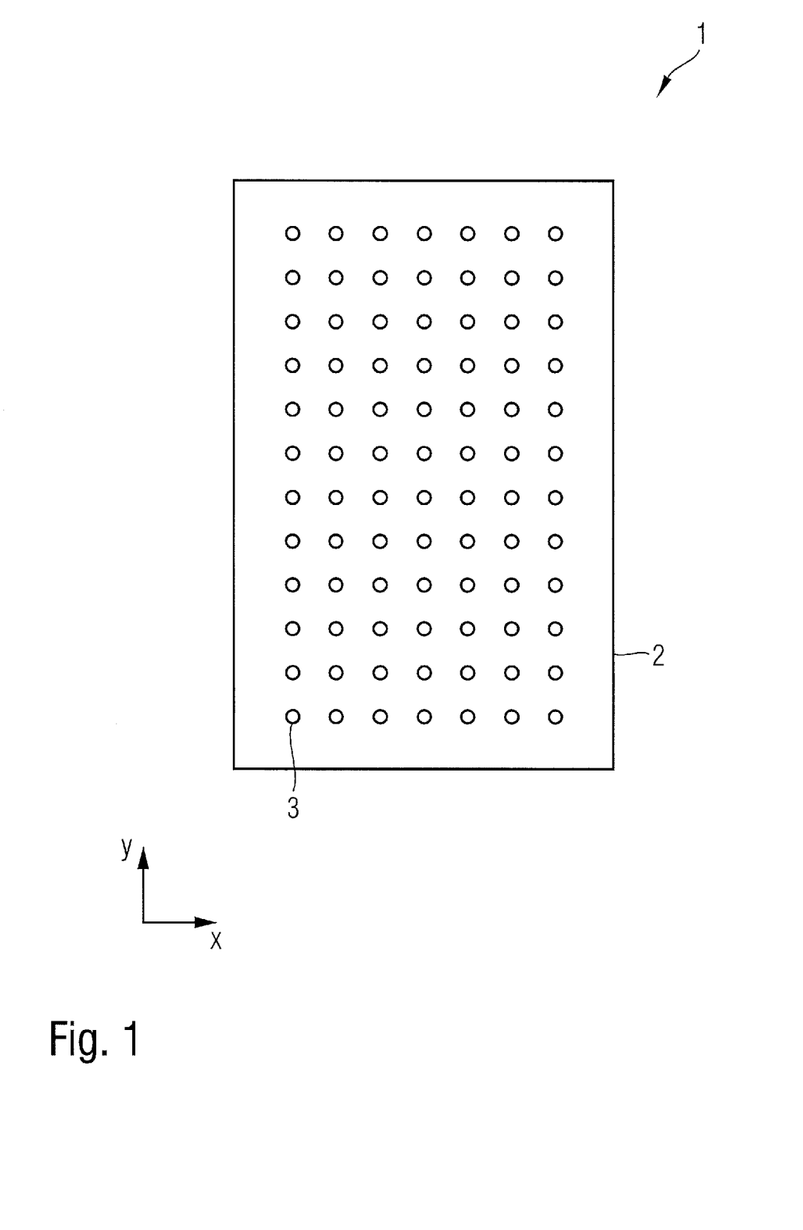
FIG. 1 shows an exemplary embodiment of a base plate of a universal holding apparatus according to the first aspect of the present invention.

A universal holding apparatus 1 as illustrated in FIGS. 4, 5, 6, 7A, 7B comprises a base plate 2 as shown in FIG. 1. The base plate 2 is configured to mount device under test, DUT, holders for holding a device under test DUT such as an electronic device in particular a mobile communication device. The base plate 2 as illustrated in the exemplary embodiment of FIG. 1 comprises a plurality of mounting holes 3 arranged in a predetermined array. In the illustrated embodiment the mounting holes 3 are arranged in a mounting hole grid array with a predetermined spacing between each of the mounting holes 3. The spacings between the mounting holes 3 can vary in different embodiments. Further the form of the mounting holes can vary in different embodiments. The base plate 2 allows to mount device under test, DUT, holders anywhere on the base plate 2. The device under test, DUT, holders are positionable on the base plate 2 to clamp a device under test, DUT, between them. Each device under test, DUT, holder comprises a pad wherein the pad of at least one of the device under test, DUT, holders for holding the device under test, DUT, is slidable to adjust a clamping distance CD between the device under test holders for engaging the device under test, DUT.

Figure 2:
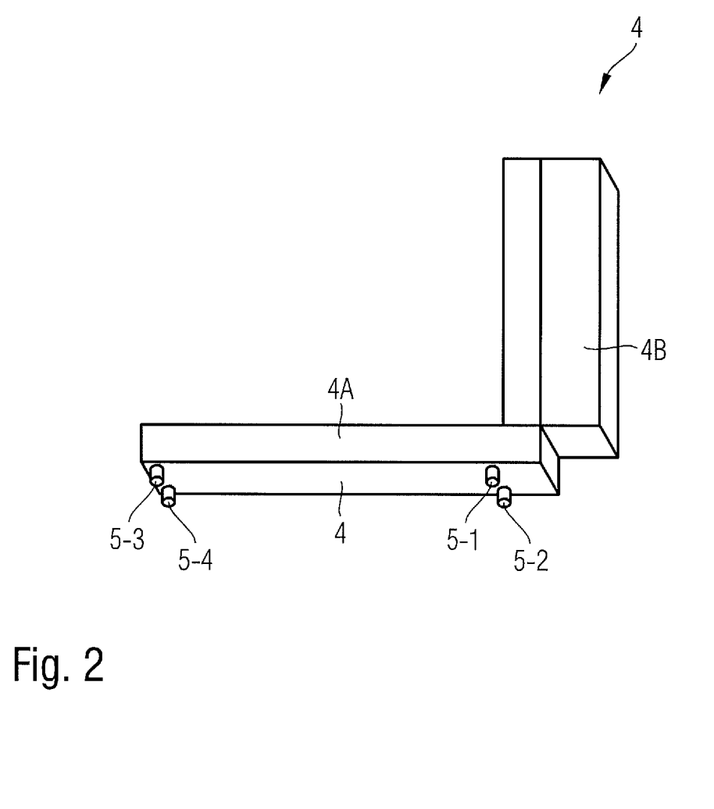
FIG. 2 shows a possible exemplary embodiment of a device under test holder as used by the universal holding apparatus according to the first aspect of the present invention.

FIG. 2 shows a possible exemplary embodiment of a device under test, DUT, holder used by a universal holding apparatus 1 according to the first aspect of the present invention. FIG. 2 shows a device under test holder 4 having an L-shaped body 4A comprising an attached pad 4B. The pad 4B can be formed by an elastic cushion pad made of elastic material. The L-shaped body 4A of the DUT-holder 4 comprises in the illustrated embodiment four mounting protrusions 5-1, 5-2, 5-3, 5-4 adapted to be inserted in to the mounting holes 3 of the base plate 2. The mounting protrusions 5-i can be formed by pins or lugs as illustrated FIG. 2.

The protrusions 5-i face the base plate 2 when placing the DUT holder 4 on the base plate 2. There are at least two pairs of mounting protrusions at the bottom side of the body 4A at a distance matching the mounting hole grid array at the base plate 2.

The first protrusion pair 5-1, 5-2 is at the front end of the L-shaped body 4-1 and the second protrusion pair 5-3, 5-4 is on the rear end of the L-shaped body 4A.

Figure 3:
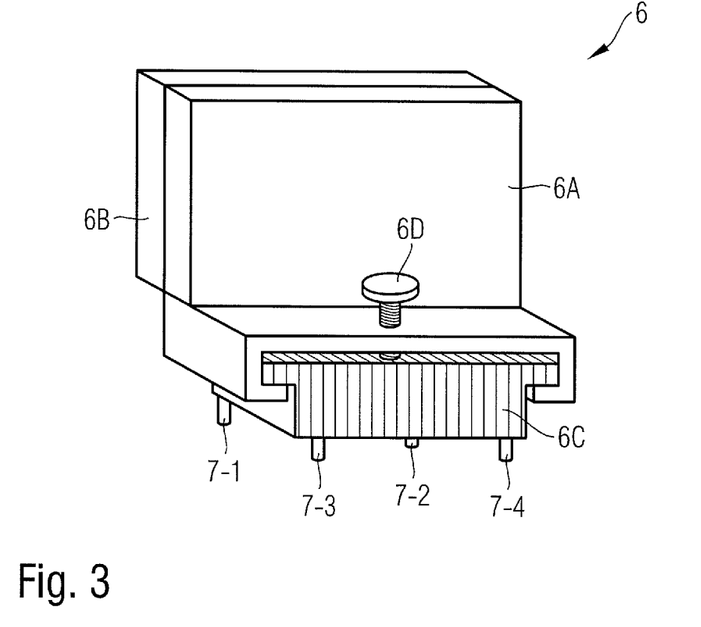
FIG. 3 shows a further exemplary embodiment of a device under test holder as used by the universal holding apparatus according to the first aspect of the present invention.

FIG. 3 shows a further device under test holder 6 comprising an L-shaped body 6A to which a pad 6B is attached. The pad 6B of the device under test holder 6 is attached to the body 6A which is slidable to adjust a clamping distance CD between the device under test holders for engaging the respective device under test DUT. The body 6A of the DUT-holder 6 is slidable on a base portion 6C of the device under test holder 6 having two pairs of mounting protrusions 7-1, 7-2, 7-3, 7-4 adapted to be inserted in to the mounting holes 3-i of the base plate 2. The body 6A of the device under test holder 6 is slidable relative to the base portion 6C and can be locked by a locking screw 6D of the device under test holder 6 in a fixed position.

Figure 4:
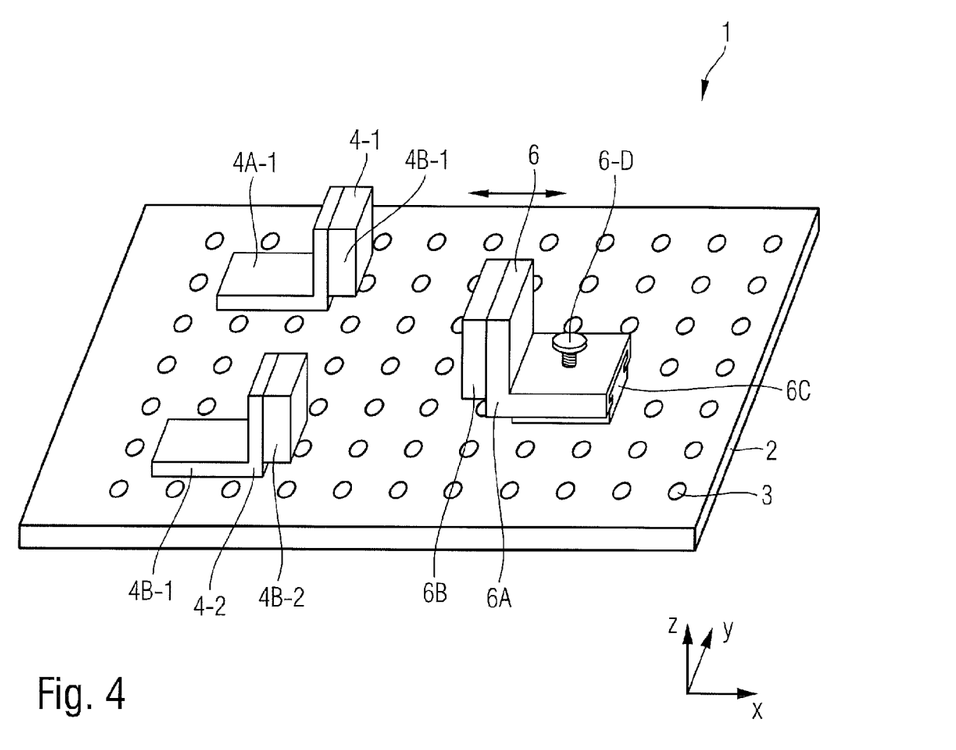
FIG. 4 shows a perspective view on a universal holding apparatus comprising a base plate and DUT-holders according to the first aspect of the present invention.
Figure 5:
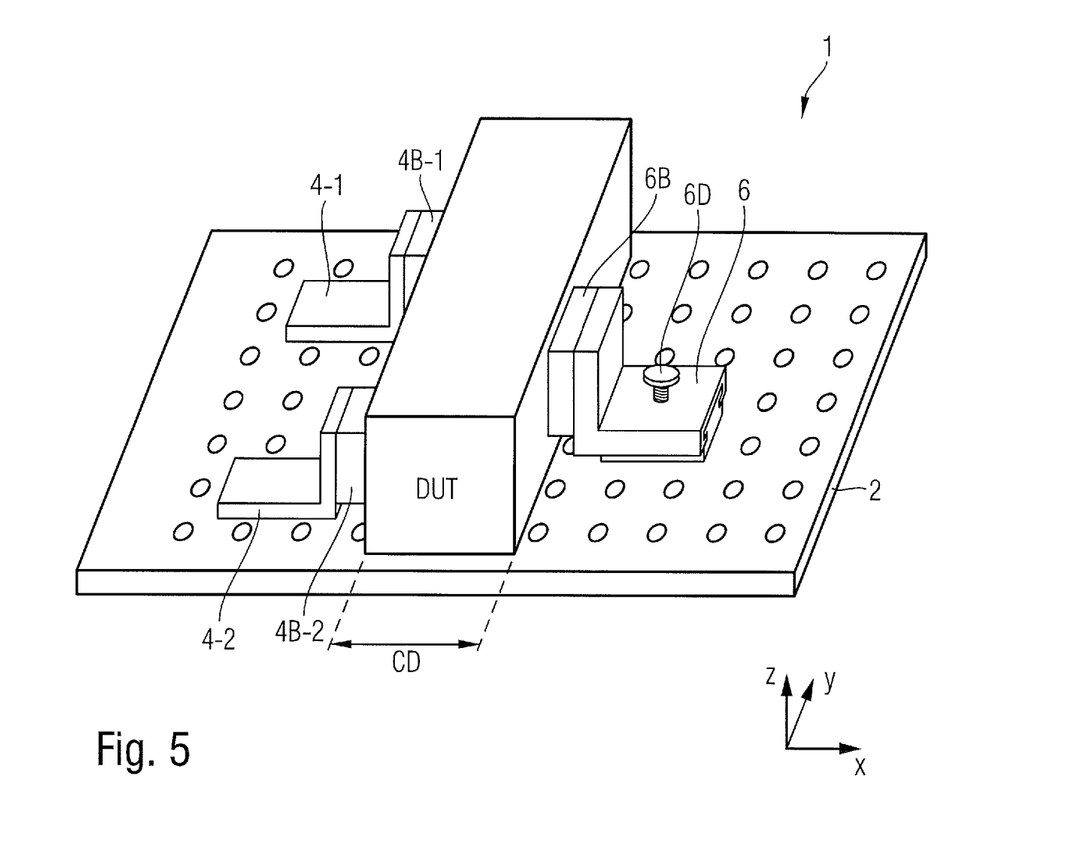
FIG. 5 shows an exemplary embodiment of a universal holding apparatus according to the first aspect of the present invention with a clamped device under test.

FIG. 4 shows a perspective view on an exemplary embodiment of an universal holding apparatus 1 according to the first aspect of the present invention comprising two device under test holders 4-i of a first type as illustrated in FIG. 2 and a single device under test holder 6 of a second type as illustrated in FIG. 3. As can be seen in FIG. 4 the cushion pads 4B-1, 4B-2 of the device under test holders 4-1, 4-2 and the cushion pad 6B of the other device under test holder 6 face each other wherein the pad 6B of the device under test holder 6 is slidable in x-direction relative to the base portion 6C to adjust a clamping distance CD between the device under test holders 4-1, 4-2 on one side and the device under test holder 6 on the other side for engaging a device under test DUT as illustrated in the perspective view of FIG. 5. It can be seen in FIG. 5 that a clamping distance CD between the cushion pads 4B, 6B is adjusted with the device under test DUT placed between the device under test holders 4-1, 4-2, 6. In a possible embodiment the device under test DUT clamped between the device under test holders comprises a mobile device in particular a mobile device with a flat casing such as a smartphone. With the universal holding apparatus 1 according to the present invention it is possible to clamp a flat mobile device under test DUT horizontally or vertically between the pads of the device under test holders 4, 6-depending on the tests to be performed. The flat mobile device DUT clamped between the pads can comprise a smartphone having control buttons and test access ports to be connected to a test equipment.

Figure 7A:
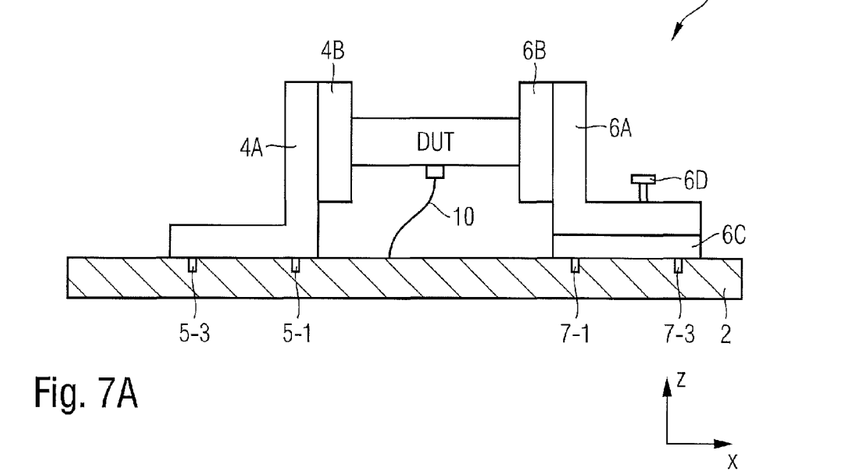
FIGS. 7A, 7B show sectional views for illustrating different positions of a clamped device under test.
Figure 7B:
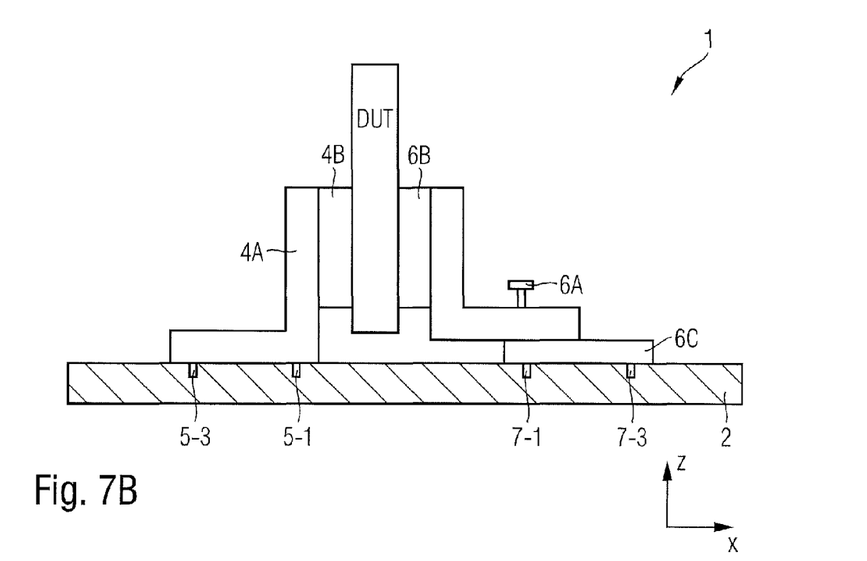
Figure 8:
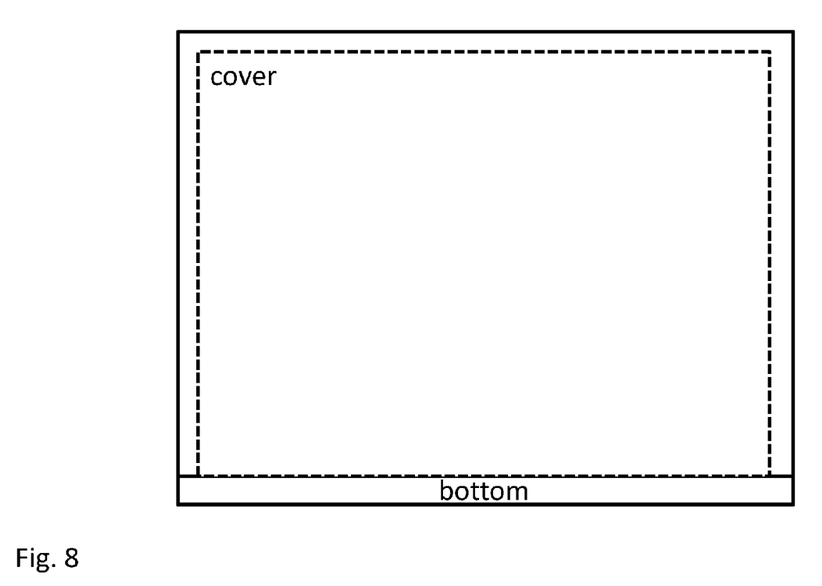
FIG. 8 illustrates a bottom and a cover of a shielding box.

As illustrated in FIGS. 7A, 7B the same device under test DUT comprising a flat casing can be clamped horizontally or vertically between the pads of the device under test holders 4, 6. FIG. 7A shows a device under test DUT clamped between the cushion pads 4b, 6b horizontally i.e. parallel to the base plate 2 of the universal holding apparatus 1. FIG. 7B shows the same device under test DUT clamped between the cushion pads 4b, 6b of the device under test holders vertically i.e. perpendicular to the base plate 2 of the universal holding apparatus 1. In the horizontal position as illustrated in FIG. 7A it is possible to connect access ports at the front or backside of the device under test DUT for performing tests. It is possible to access control buttons provided at the front side of device under test for example a user interface UI of a mobile smartphone. The universal holding apparatus 1 according to the present invention ensures that all required device under test control buttons and/or test access ports are not obstructed during test.

Figure 6:
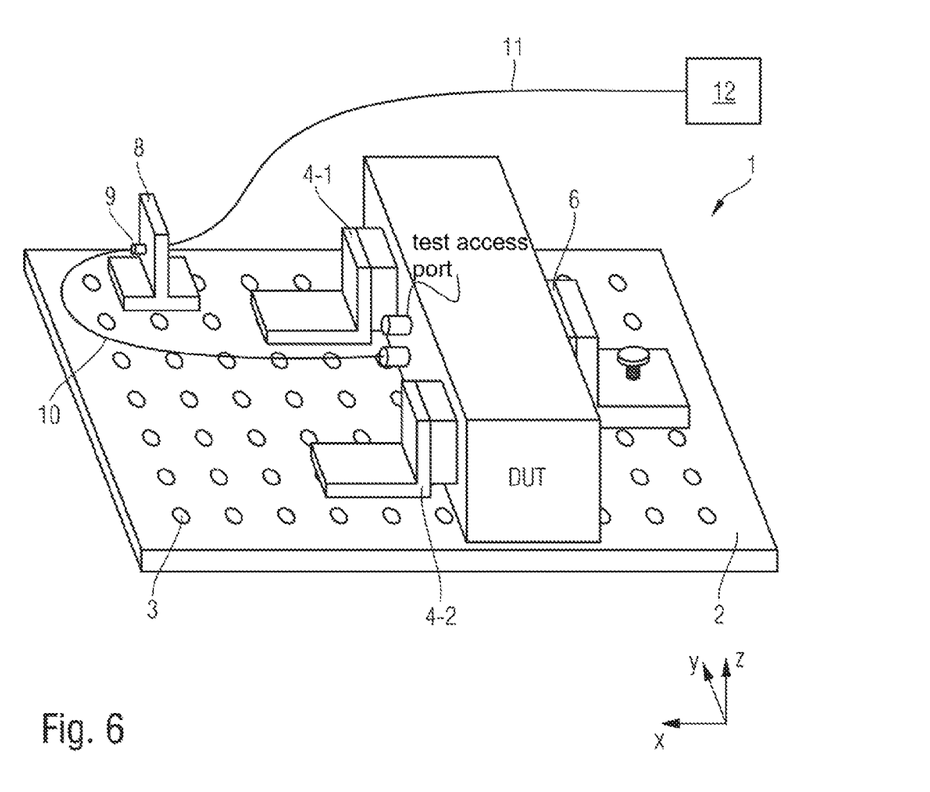
FIG. 6 shows a further perspective view on a possible exemplary embodiment of a universal holding apparatus according to the first aspect of the present invention with a clamped in device under test.

FIG. 6 shows a further exemplary embodiment for universal holding apparatus 1 according to the first aspect of the present invention. In the illustrated embodiment the universal holding apparatus 1 comprises at least one RF holder 8 mounted on the base plate 2. The RF holder 8 comprises in the illustrated embodiment at least one adapter 9 provided for securing an RF connection between a RF connection cable 10 of the device under test and a RF connection cable 11 of a test equipment device 12. In the illustrated embodiment the RF connection cable 10 is plugged into a RF port of the device under test DUT. The RF holder 8 avoids shaking, twisting and pulling by the RF cable from the test equipment 12 that could cause the delicate RF connection at the device under test DUT to come off or to be damaged. If the RF connection port of the device under test DUT is provided at the backside of the casing of the device under test the RF connection cable 10 can be easily plugged into the device under test port if the device under test DUT is clamped horizontally between the device under test holders 4, 6 as illustrated in FIG. 7A. Horizontal clamping as illustrated in FIG. 7A provides a space on the backside of the device under test DUT for plugging in a cable into corresponding ports of the device under test DUT. These cables can comprise RF connection cables 10 as illustrated in FIG. 7A and/or power connection cables. Provision of DUT-holders 4, 6 allows also to clamp odd shaped prototype mobile devices DUT for performing tests. By securing a device under test DUT vertically as illustrated in FIG. 7B it is possible to view conveniently a user interface display of the device under test DUT during its testing. In a possible embodiment the adapter 9 of the RF holder 8 forms a SMA jack to SMA jack adapter for securing an RF connection between the device under test DUT and the test equipment 12. The universal holding apparatus 1 as illustrated in FIG. 6 avoids free hanging RF connections between the device under test DUT and the test equipment device 12. Consequently a disruption of the RF connection during the test due to shaking, twisting or pulling of RF connection cables is avoided. Further the handling of the device under test DUT is facilitated because access to any kind of control buttons or access ports on any side of the casing of the device under test DUS is possible. Further by clamping the device under test DUT horizontally or vertically between the device under test holder 4, 6 it is possible to a view a display of the device under test from above (if clamped horizontally as illustrated in FIG. 7A) or from the side (if clamped vertically as illustrated in FIG. 7B). The cushion pads 4B, 6B are made from an elastic material so that damaging of the device under test DUT casing during test is avoided.

In a possible embodiment for testing a device under test DUT the necessary device under test holders 4, 6 are first placed on the base plate 2 inserting the protrusions of the device under test holders 4, 6 into the corresponding reception mounting holes 3 provided within the base plate 2. Then the device under test DUT is placed between cushion pads 4B, 6B of the device under test holders 4, 6 facing each other and an adjustment of the clamping distance CD to the dimensions of the device under test casing is done by sliding the body 6A of the device under test 6 over the bottom portion 6C of the device under test holder 6. Finally after the clamping distance CD has been adjusted the body 6A the device under test holder 6 is fixed in the adjusted position by turning the locking screw 6D manually in a fixed position.

In a possible embodiment of the universal holding apparatus 1 according to the first aspect of the present invention the base plate 2 can be put into a receiving chamber or shielding box. This shielding box can comprise a bottom and a cover forming the receiving chamber configured to receive the universal holding apparatus 1 according to the first aspect of the present invention. The shielding box comprises a bottom and a cover made in a possible embodiment on aluminum. The cover can be lined in a possible embodiment with absorber material to minimize reflections. The cover can comprise in a possible embodiment a handle to close the shielding box after having inserted a universal holding apparatus 1 holding a device under test DUT for testing. The shielding box provides effective RF shielding during test of the device under test DUT. The invention provides according to the second aspect a shielding box with a bottom and a cover forming a receiving chamber configured to receive a universal holding apparatus 1 adapted to hold a device under test DUT. The invention provides further according to a third aspect a testing arrangement with a test device 12 connected a device under test DUT held by universal holding apparatus 1 according to the first aspect of the present invention.

The universal holding apparatus 1 according to the first aspect of the present invention has been described with reference to the enclosed FIGS. 1 to 7. The same elements comprise same reference numbers. The universal holding apparatus 1 according to the first aspect of the present invention is not limited to the illustrated embodiments. The universal holding apparatus 1 according to the present invention can comprise further embodiments.

In the illustrated embodiments device under test DUT can be clamped between device under test holders horizontally as illustrated in FIG. 7A or vertically as illustrated in FIG. 7B. If the device under test DUT is clamped horizontally between the cushion pads its housing or casing extends parallel to the base plate 2. If the device under test DUT is clamped vertically its housing or casing extends perpendicular to the base plate 2 as illustrated in FIG. 7B. In a further possible embodiment a clamping angle between the device under test DUT and the base plate 2 can also be adjusted by rotating the body portion 6A of the device under test, DUT, holder. Further it is possible to clamp a device under test DUT between two device under test holders 6 having slideable bodies 6A.

In the illustrated embodiment the device under test DUT is placed between the cushion pads 4B, 6B of the device under test, DUT, holders and the adjustment of the clamping distance CD is performed manually. In a further possible embodiment is a device under test DUT can also be placed by a robot arm between the cushion pads 4B, 6B of the device under test holders 4, 6 and the adjustment of the clamping distance CD can be performed automatically by a control program. In a possible implementation the size and form of the device under test casing is known or predetermined and the adjustment control program can adjust the clamping distance CD using the size of the DUT casing. In a still further embodiment the size of the device under test DUT casing can be measured and the control program performs the clamping distance adjustment automatically using the received sensor data. Also the connection of the connection cables such as RF connection cables, USB connections or power supply connections can be either performed manually or automatically.

In a further possible embodiment device under test DUT can be clamped in different positions between the cushion pads of the DUT holders 4, 6 for performing different test sequences. A device under test DUT as illustrated in FIG. 7A can first be clamped horizontally between the cushion pads 4, 6B performing a first test sequence and then be manually or automatically brought into the vertical clamping position as illustrated in FIG. 7B for performing another test sequence.

In a further possible embodiment of the universal holding apparatus 1 according to the present invention the clamping pressure between the cushion pads 4B, 6B can be monitored to avoid a too high pressure on the DUT casing during testing. In the illustrated embodiments device under test DUT is clamped being device under test holders 4C fixed to a top side of the base plate 2. The base plate 2 can be simply put on a table or working bench and the device under test DUT holders can be inserted into the mounting holes 3 of the mounting hole grid array of the base plate 2.

In a further possible embodiment of the universal holding apparatus 1 according to the first aspect of the present invention its base plate 2 can be moved in x-direction, in y-direction or in z-direction. In a further possible embodiment the base plate 2 can be rotated around an x-axis, around an y-axis and/or around a z-axis before or after clamping the device under test DUT between the cushion pads and/or during of connecting the device under test DUT. The translation movement and/or rotation movement of the base plate 2 can also be controlled by a control program performing the testing of the device under test DUT.

In the illustrated embodiments the base plate 2 is a flat base plate comprising a mounting hole grid array with predetermined spacings between the mounting holes 3. In a further embodiment the base plate 2 can comprise a shaped surface adapted to the form of the DUT casing. In a possible exemplary implementation the base plate 2 can comprise a cylinder mantle.

After testing the device under test holders 4, 6 maybe removed from the base plate 2 and arranged for another device under test DUT having different dimension. In a further possible exemplary implementation the mounting holes 3 of the mounting hole grid array as illustrated in FIG. 1 can comprise xy-coordinates to insert corresponding mounting protrusions 5,7 of the device under test DUT holders at matching xy-coordinates under the control of a test control program. For example the test program can indicate that a device under test holder 6 having four mounting protrusions is to be inserted into mounting holes (X1, Y1; X2, Y2). This allows testing of devices under test DUT of different shapes and sizes sequentially by rearranging the device under test holders 4, 6 on the base plate 2 automatically. In the illustrated embodiment the device under test holders 4, 6 comprise two pairs of mounting protrusions. In other embodiments the number of mounting protrusion pairs can vary. In a possible embodiment each device under test DUT holder comprises only a simple mounting protrusion pair 5, 7. The mounting protrusion pairs 5, 7 of the DUT holder 4, 6 prohibit an unwanted rotation of the clamped DUT relative to the mounting hole grid array forming a rectangle grid in x-direction and y-direction. Consequently a DUT having a casing with a rectangular shape is oriented either in x-direction or in y-direction after having been clamped between the DUT holder 4, 6. In the illustrated embodiments the depth of the mounting holes is less than the height of the base plate 2. In a further possible embodiments the mounting protrusions 5, 7 can be inserted through openings of the base plate 2 so that the ends pass through the openings. In this embodiment it is easier to remove the device under test holder 4, 6 from the base plate 2 by pushing on the distal end of the respective mounting protrusions.

The invention claimed is:

1. A universal holding apparatus for holding a device under test, DUT, said universal holding apparatus comprising:
   a base plate configured to mount at least two DUT-holders for holding the device under test, DUT, each DUT holder having at least one pad attached to a body of said DUT holder,
   wherein the at least two DUT-holders are positionable on said base plate to clamp said device under test, DUT, between them,
   wherein the body of at least one of said DUT-holders for holding the device under test, DUT, is slidable relative to a base portion of said DUT holder to adjust a clamping distance between the DUT-holders for engaging said device under test, DUT,
   wherein said base plate comprises a plurality of mounting holes arranged in a predetermined array comprising a mounting hole grid array with predetermined spacings provided between each of said mounting holes, and
   wherein the bodies of the DUT-holders comprise one or more mounting protrusions adapted to be inserted in to the mounting holes of the base plate.

2. The universal holding apparatus according to claim 1, wherein the slidable body of said at least one DUT-holder is fixable by a locking screw in a fixed position.

3. The universal holding apparatus according to claim 1, wherein the pads of the DUT-holders are formed by elastic cushion pads.

4. The universal holding apparatus according to claim 1, wherein at least one RF holder is mounted to said base plate, said RF holder comprising at least one adapter provided for securing an RF connection between an RF connector of the device under test, DUT, and a test equipment.

5. The universal holding apparatus according to claim 4, wherein the DUT-holders and/or RF holder comprises one or more mounting protrusions, especially pins or lugs, adapted to be inserted into said mounting holes of said base plate.

6. The universal holding apparatus according to claim 1, wherein said device under test, DUT, is a flat mobile device.

7. The universal holding apparatus according to claim 6, wherein said DUT-holders are adapted to clamp said flat mobile device under test horizontally or vertically between the pads of said DUT-holders.

8. The universal holding apparatus according to claim 6, wherein said flat mobile device clamped between said pads comprises a smartphone having control buttons and test access ports to be connected to a test equipment.

9. A shielding box comprising
   a bottom and
   a cover forming a receiving chamber configured to receive a universal holding apparatus adapted to hold a device under test, DUT, said universal holding apparatus comprising:
   a base plate configured to mount at least two DUT-holders for holding the device under test each DUT holder having at least one pad attached to a body of said DUT holder,
   wherein the at least two DUT-holders are positionable on said base plate to clamp said device under test, DUT, between them,
   wherein the body of at least one of said DUT-holders for holding the device under test, DUT, is slidable relative to a base portion of said DUT holder to adjust a clamping distance between the DUT-holders for engaging said device under test, DUT,
   wherein said base plate comprises a plurality of mounting holes arranged in a predetermined array comprising a mounting hole grid array with predetermined spacings provided between each of said mounting holes, and wherein the bodies of the DUT-holders comprise one or more mounting protrusions adapted to be inserted in to the mounting holes of the base plate.

\* \* \* \* \*